United States Patent
Munakata et al.

(10) Patent No.: US 12,169,225 B2
(45) Date of Patent: Dec. 17, 2024

(54) SECONDARY BATTERY INSPECTION METHOD AND SECONDARY BATTERY INSPECTION DEVICE

(71) Applicant: Toyo System Co., Ltd., Fukushima (JP)

(72) Inventors: Ichiro Munakata, Fukushima (JP); Satoshi Tanno, Fukushima (JP); Hideki Shoji, Fukushima (JP)

(73) Assignee: TOYO SYSTEM CO., LTD, Fukushima (JP)

( * ) Notice: Subject to any disclaimer, the term of this patent is extended or adjusted under 35 U.S.C. 154(b) by 0 days.

(21) Appl. No.: 17/609,854

(22) PCT Filed: Mar. 19, 2021

(86) PCT No.: PCT/JP2021/011440
§ 371 (c)(1),
(2) Date: Nov. 9, 2021

(87) PCT Pub. No.: WO2021/210346
PCT Pub. Date: Oct. 21, 2021

(65) Prior Publication Data
US 2023/0034016 A1      Feb. 2, 2023

(30) Foreign Application Priority Data
Apr. 13, 2020 (JP) ................. 2020-071765

(51) Int. Cl.
*G01R 31/389* (2019.01)
*G01R 31/367* (2019.01)
(Continued)

(52) U.S. Cl.
CPC ......... *G01R 31/389* (2019.01); *G01R 31/367* (2019.01); *G01R 31/374* (2019.01); *G01R 31/3842* (2019.01)

(58) Field of Classification Search
CPC .. G01R 31/389; G01R 31/367; G01R 31/374; G01R 31/3842; Y02E 60/10
See application file for complete search history.

(56) References Cited

U.S. PATENT DOCUMENTS

2003/0206021 A1* 11/2003 Laletin ................. G01R 31/386
324/426
2007/0212596 A1*  9/2007 Nebrigic ............... H01M 10/42
429/61
(Continued)

FOREIGN PATENT DOCUMENTS

CN    113383338 A  *  9/2021  ......... G01R 31/3648
GB    2532726 A        6/2016
(Continued)

OTHER PUBLICATIONS

English Translation of Written Opinion for PCT/JP2021/011440 (Year: 2022).*
(Continued)

*Primary Examiner* — Mi'schita' Henson
(74) *Attorney, Agent, or Firm* — Holtz, Holtz & Volek PC

(57) ABSTRACT

Provided is a secondary battery inspection device capable of improving inspection accuracy while simplifying the inspection of a secondary battery. Value of a model parameter of a secondary battery model is identitied based on a sampling period T. In the secondary battery model, impedance of internal resistance of a secondary battery 200 is expressed by an IIR transfer function and an FIR transfer function. When impulse current I(t) is input to a specified model as the secondary battery model the value of the model parameter of which is identified, a model output voltage as a voltage change form output from the specified model is estimated. The performance of the secondary battery 200 according to the sampling period T is evaluated based on the measurement result of the voltage of the secondary battery 200 when (Continued)

the impulse current I(t) flows into the secondary battery 200, and the specified model output voltage.

4 Claims, 8 Drawing Sheets

(51) Int. Cl.
   *G01R 31/374* (2019.01)
   *G01R 31/3842* (2019.01)

(56) References Cited

U.S. PATENT DOCUMENTS

| | | | |
|---|---|---|---|
| 2011/0060538 A1 | 3/2011 | Fahimi et al. | |
| 2014/0372054 A1 | 12/2014 | Wang et al. | |

FOREIGN PATENT DOCUMENTS

| | | | |
|---|---|---|---|
| JP | 2013253784 A | 12/2013 | |
| JP | 5924617 B2 | 4/2016 | |
| JP | 6842212 B1 | 3/2021 | |
| JP | 2021106128 A | 7/2021 | |
| WO | 2017002953 A1 | 1/2017 | |
| WO | 2019187264 A1 | 10/2019 | |
| WO | WO-2021149482 A1 * | 7/2021 | ........... G01R 31/367 |
| WO | WO-2022244378 A1 * | 11/2022 | ........... G01R 31/367 |

OTHER PUBLICATIONS

International Search Report re PCT/JP2021/011440 mailed Jun. 1, 2021 (4 pages).

Extended European Search Report (EESR) dated May 23, 2023, issued in counterpart European Application No. 21789494.8.

Korean Office Action dated Jan. 31, 2024 (and English translation thereof) issued in counterpart Korean Application No. 10-2021-7036069.

Gong, "Modeling of Lithium-ion Battery Considering Temperature and Aging Uncertainties", A dissertation submitted in partial fulfillment of the requirements for the degree of Doctor of Philosophy (Automotive Systems Engineering) in the University of Michigan-Dearborn; 2016 2016.

Piret, et al., "Passive and active tracking of electrochemical impedance of a drone battery", EEVC 2015—European Battery, Hybrid and Fuel Cell Electric Vehicle Congress, Dec. 2015, Bruxelles, Belgium; hal-01244009.

* cited by examiner

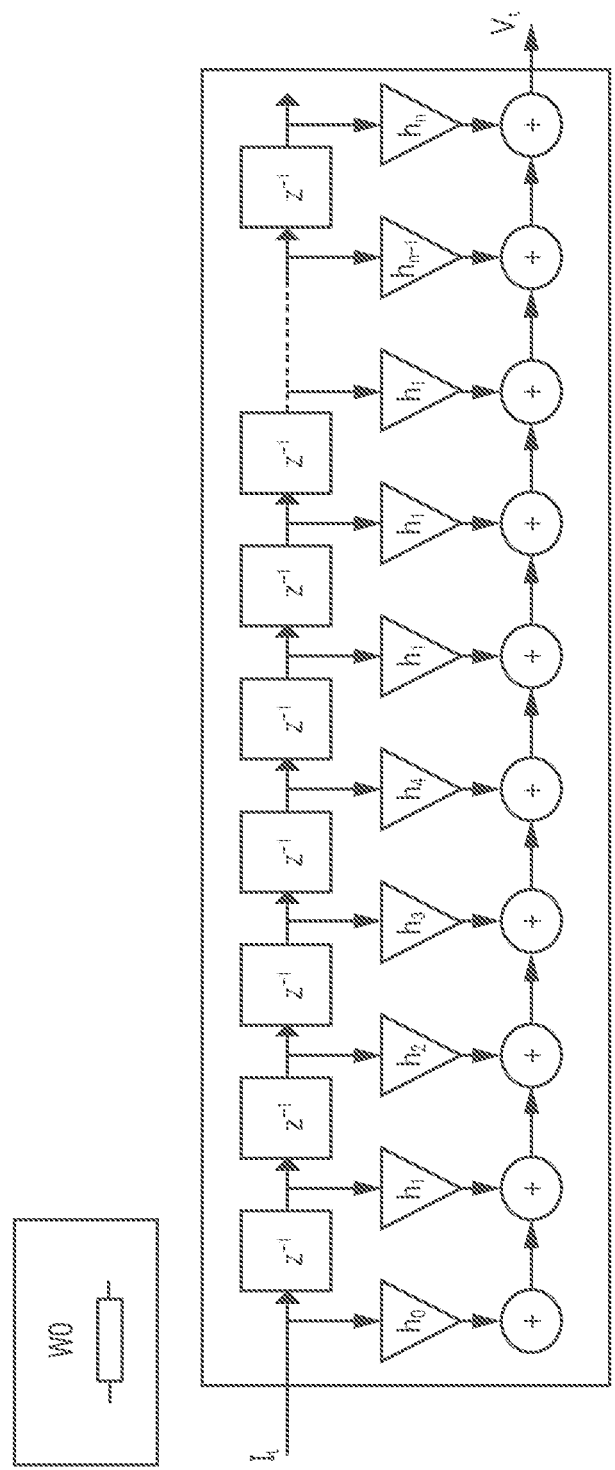

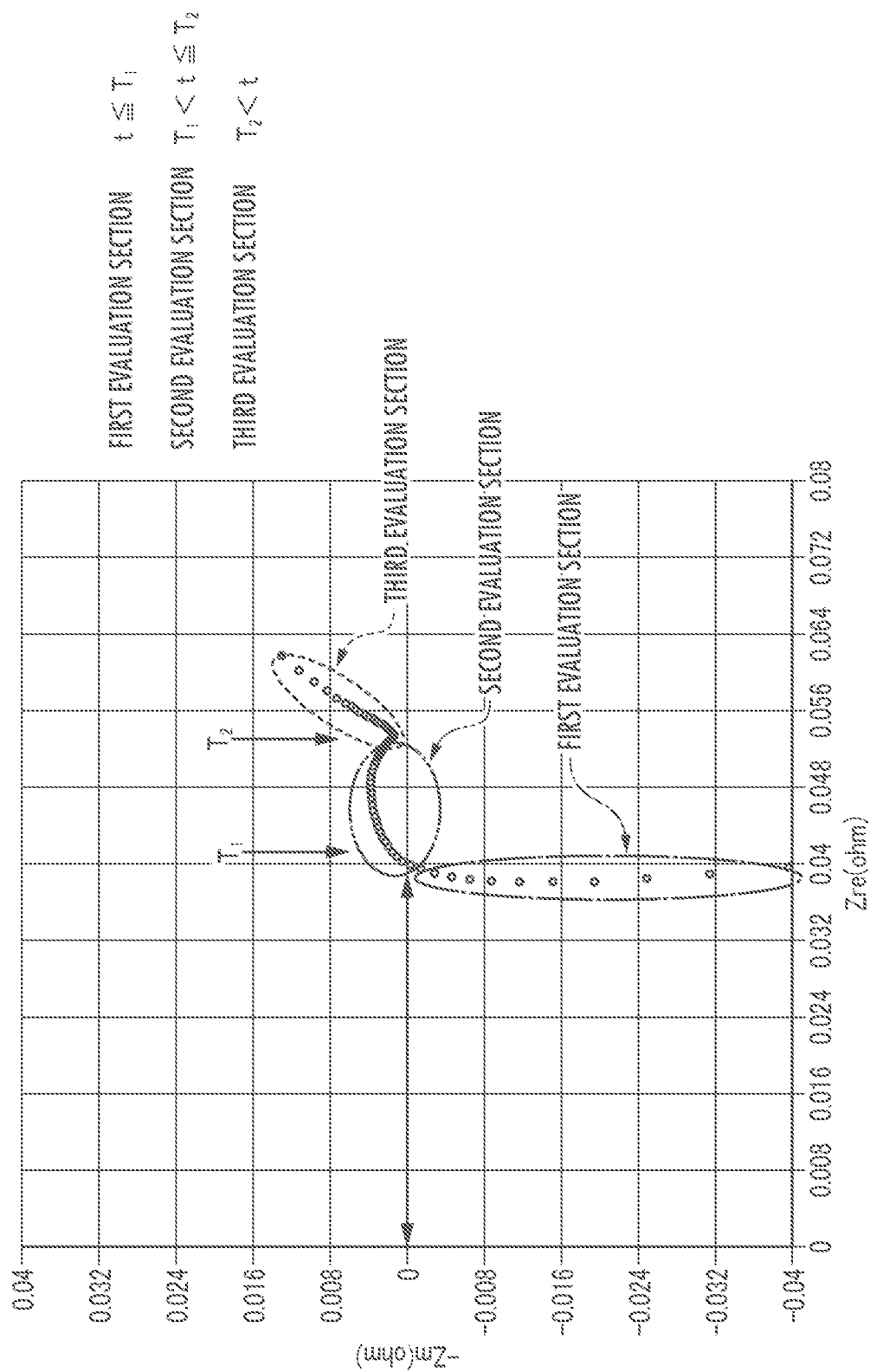

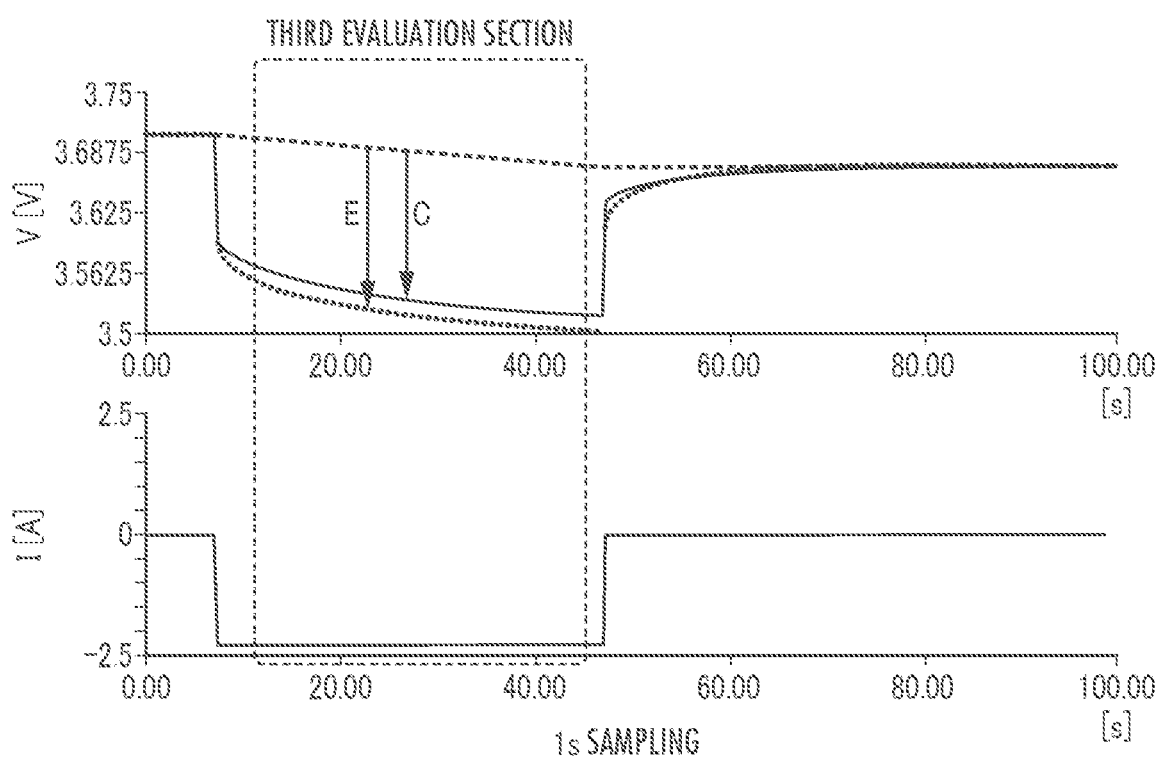

SECONDARY BATTERY INSPECTION METHOD AND SECONDARY BATTERY INSPECTION DEVICE

CROSS-REFERENCE TO RELATED APPLICATIONS

This patent application is a U.S. National Stage filing of, and claims priority to and all advantages of, PCT Patent Application Number PCT/JP2021/011440 filed on Mar. 19, 2021 and Japanese Patent Application No. 2020-071765 filed on Apr. 13, 2020, the contents of both of which are incorporated herein by reference in their entireties.

TECHNICAL FIELD

The present invention relates to a technique for inspecting a secondary battery such as a lithium-ion battery.

BACKGROUND ART

As a method of inspecting the internal state of a secondary battery, an AC impedance analysis method based on a frequency response analysis (FRA) method is well known, and a method of applying an equivalent circuit model to decompose the secondary battery into time-constant elements in order to interpret various internal reactions of the secondary battery is established.

CITATION LIST

Patent Literature

Patent Literature 1: Japanese Patent No. 5924617

SUMMARY OF INVENTION

Technical Problem

However, multipoint measurements from a high frequency range of about 10 kHz up to a low frequency range of about 10 mHz to 100 mHz are required for the AC impedance analysis. Therefore, the inspection of the secondary battery takes a long time. Further, since a dedicated measuring device is required, it is difficult to put the method into practical use in such a scene that a short takt time is prerequisite such as a mass production line. Although an inspection machine having a certain degree of accuracy in a short time is required upon mass production shipment inspection of secondary batteries and product acceptance inspection, since the characteristics of each battery is changing depending on the operating state of the battery (such as voltage (SOC), operating current, and battery temperature), inspection must be performed by setting constant conditions. Therefore, an inspection device with good reproducibility is desired. Although pass/fail determination criteria are set from a statistical population distribution in the mass production line or the like, such settings are possible only when the inspection conditions are fixed, and there were hardly any methods of being able to determine pass/fail of a secondary battery on the market.

Therefore, the object of the present invention is to provide a secondary battery inspection device or the like capable of improving inspection accuracy while simplifying the inspection of a secondary battery.

Solution to Problem

A secondary battery inspection device according to the present invention includes:

a voltage recognition element which recognizes a measurement result of voltage of a secondary battery when an impulse current flows into the secondary battery;

a model parameter setting element which identifies, based on a sampling period, a value of a model parameter of a secondary battery model in which impedance of internal resistance of the secondary battery is expressed by transfer functions respectively representing an IIR system and an FIR system;

a voltage estimation element which, when the impulse current is input to a specified model as the secondary battery model the value of the model parameter of which is identified by the model parameter setting element, estimates a model output voltage as a voltage change form output from the specified model; and an evaluation element which evaluates the performance of the secondary battery according to the sampling period based on the measurement result of the voltage of the secondary battery recognized by the voltage recognition element, and the specified model output voltage estimated by the voltage estimation element.

It is preferred that the model parameter setting element individually identifies the value of the model parameter based on each of a plurality of sampling periods, respectively, the voltage estimation element estimates a plurality of model output voltages as voltage change forms respectively output from a plurality of specified models when the impulse current is input to the plurality of specified models as individual secondary battery models with the values of the model parameter identified by the model parameter setting element, and the evaluation element evaluates a plurality of performances of the secondary battery respectively according to respective of the plurality of sampling periods based on the measurement result of the voltage of the secondary battery recognized by the voltage recognition element, and respective of the plurality of specified model output voltages estimated by the voltage estimation element.

It is also preferred that the secondary battery inspection device further includes a temperature compensation element which recognizes a measurement result of temperature of the secondary battery, wherein the model parameter setting element corrects the value of the model parameter based on the measurement result of the temperature of the secondary battery recognized by the temperature compensation element.

BRIEF DESCRIPTION OF DRAWINGS

FIG. 3D is a diagram representing an FIR transfer function of a Warburg impedance $W_O$.

FIG. 4 is an explanatory chart related to Nyquist plots of the secondary battery.

FIG. 5C is an explanatory chart related to a third evaluation index according to a second sampling period.

DESCRIPTION OF EMBODIMENT (Configuration of Secondary Battery Inspection Device)

Figure 1:
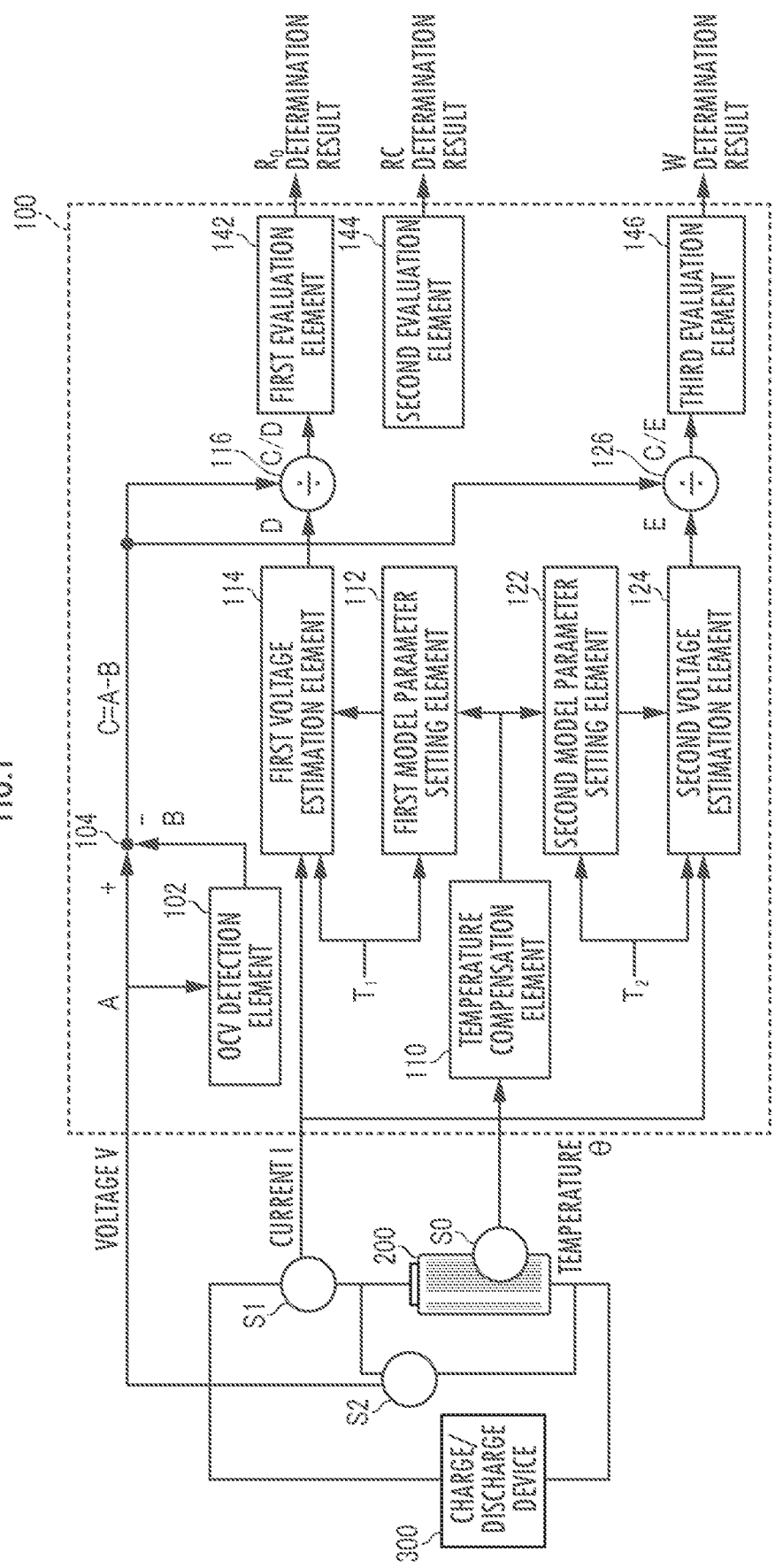
FIG. 1 is an explanatory diagram related to the configuration of a secondary battery inspection device as one embodiment of the present invention.

A secondary battery inspection device 100 as one embodiment of the present invention illustrated in FIG. 1 is composed of a processor (arithmetic processing unit), a memory (storage device), an I/O circuit, and the like. In the memory or a storage device separate from this memory, a program (software) is stored and held in addition to various data such as parameters for defining a secondary battery model. For example, each of plural identifiers for identifying a secondary battery or the type of a target machine element (identified by the standard and specifications) in which this secondary battery is installed, and each of plural secondary battery models are stored and held in the memory in association with each other. The processor reads necessary program and data from the memory, and executes arithmetic processing according to the program based on the data to execute arithmetic processing or a task to be described later.

The secondary battery inspection device 100 includes an OCV detection element 102, a subtraction element 104, a temperature compensation element 110, a first sampling period output element 111, a first model parameter setting element 112, a first voltage estimation element 114, a first division element 116, a second sampling period output element 121, a second model parameter setting element 122, a second voltage estimation element 124, a second division element 126, a first evaluation element 142, a second evaluation element 144, and a third evaluation element 146.

(Secondary Battery Model)

Each of the secondary battery models is a model representing voltage V(t) output from a secondary battery 200 when current I(L) is input to the secondary battery 200. The voltage V(t) is defined by equation (01) using an open circuit voltage OCV of the secondary battery 200 and a transfer function H(t) of the internal resistance.

$$V(t)=OCV+H(t)\cdot I(t) \quad (01)$$

The transfer function H(t) of an equivalent circuit model of the internal resistance of the secondary battery is defined by equation (02).

[Math. 1]

$$H(t)=H_0(t)+\Sigma_{i=1}^m H_i(t)+H_W(t)+H_L(t) \quad (02)$$

"$H_0(t)$," "$H_1(t)$," "$H_W(t)$," and "$H_L(t)$" are defined by parameters representing the characteristics of the internal resistance of the secondary battery.

Figure 2A:
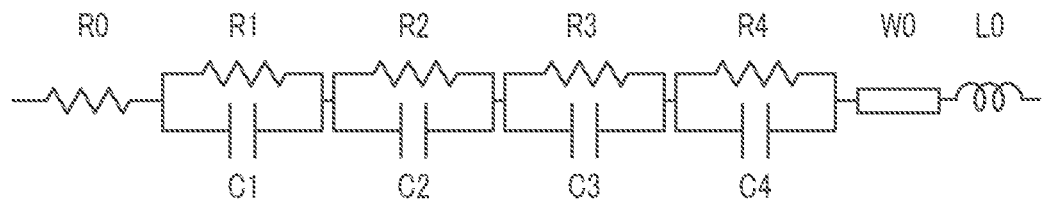
FIG. 2A is a first illustrated diagram of an equivalent circuit of the internal resistance of a secondary battery.
Figure 2B:
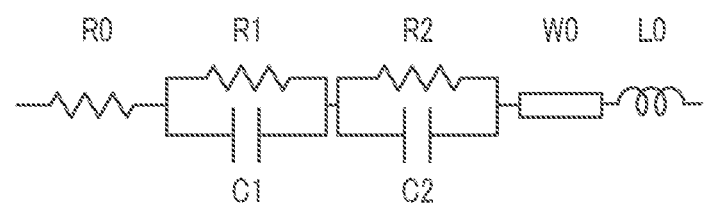
FIG. 2B is a second illustrated diagram of the equivalent circuit of the internal resistance of the secondary battery.
Figure 2C:
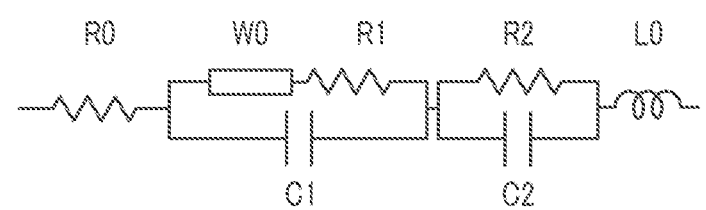
FIG. 2C is a third illustrated diagram of the equivalent circuit of the internal resistance of the secondary battery.
Figure 2D:
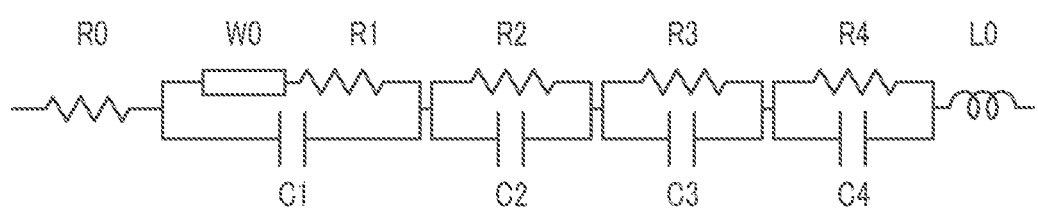
FIG. 2D is a fourth illustrated diagram of the equivalent circuit of the internal resistance of the secondary battery.

In FIG. 2A, an example of an equivalent circuit of the internal resistance of the secondary battery 200 is illustrated. In this example, the equivalent circuit of the internal resistance is defined by a series circuit of a connection resistance component $R_0$, the i-th RC parallel circuit (i=1, 2, . . . . m) composed of charge transfer resistances $R_i$ and capacitors $C_i$, a Warburg impedance $W_O$, and a coil L. In FIG. 2A, the number, m, of RC parallel circuits connected in series is "4." As illustrated in FIG. 2B, the number, m, of RC parallel circuits connected in series may be smaller than 4, or may be larger than 4. As illustrated in FIG. 2C and FIG. 2D, respectively, the Warburg impedance $W_O$ may also be connected in series with a resistance R in at least any one of RC parallel circuits (for example, in the first RC parallel circuit). Further, each capacitor C may be replaced with a CPE (Constant Phase Element). In addition, the coil L may be omitted.

Figure 3A:
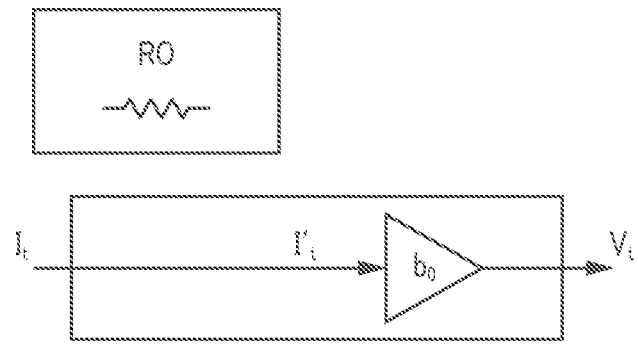
FIG. 3A is a diagram representing a transfer function of a connection resistance component $R_0$ of the secondary battery.

The transfer function $H_0(z)$ of the resistance $R_0$ is defined by equation (10). In FIG. 3A, a block diagram representing the transfer function $H_0(z)$ of the resistance $R_0$ is illustrated.

$$H_0(z)=R_0 \quad (10)$$

The dependency of $R_0$ on temperature $\theta$ is predetermined according to the equation (10) based on the measurement results of Nyquist plots of a reference secondary battery at different temperatures $\theta$ (see FIG. 4), respectively. In other words, the coefficient $R_0$ is defined as a dependent variable or a function when the temperature $\theta$ for defining the transfer function $H_0(z)$ of the resistance $R_0$ is taken as the main variable.

Figure 3B:
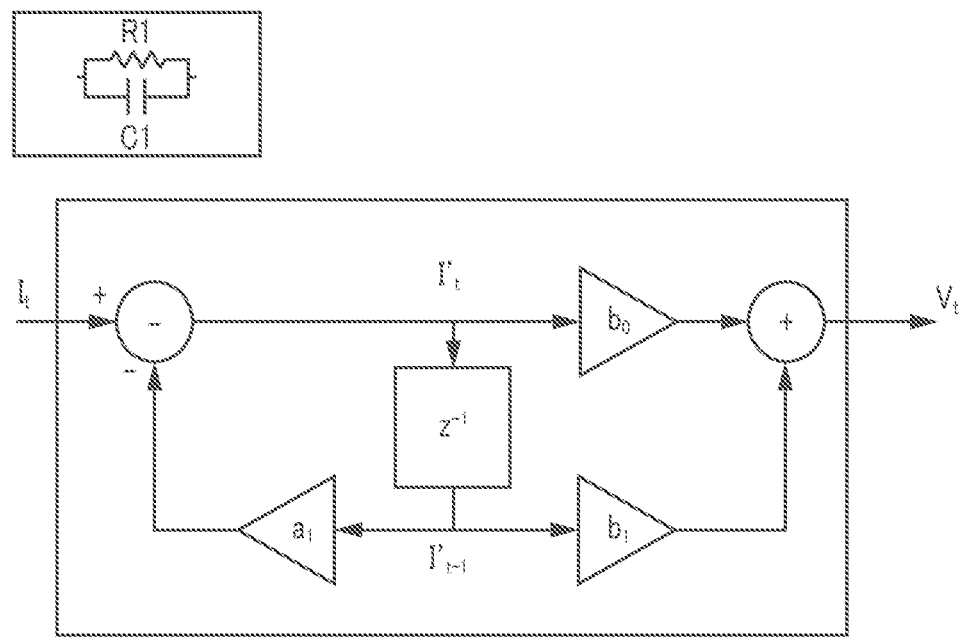
FIG. 3B is a diagram representing an IIR transfer function of the i-th RC parallel circuit composed of a charge transfer resistance $R_i$ and a capacitor $C_i$.

The transfer function $H_i(z)$ of the i-th RC parallel circuit is defined by equation (20) as an IIR (Infinite Impulse Response) system. In FIG. 3B, a block diagram representing the transfer function $H_i(z)$ of the i-th RC parallel circuit is illustrated.

$$H_i(z)=(b_0+b_i z^{-1})/(1+a_i z^{-1}) \quad (20)$$

A transfer function $H_i(s)$ of the i-th RC parallel circuit in an s region is expressed by equation (21).

$$H_i(s)=R_i/(1+\tau_i s) \text{ (where } \tau_i=1/R_i C_i) \quad (21)$$

When the transfer function $H_1(s)$ is bilinear-transformed $(s \to (2/T)(1-z^{-1})/(1+z^{-1}))$ (where T is a sampling period)), the transfer function $H_i(z)$ of the i-th RC parallel circuit in a z region is expressed by equation (22).

$$H_i(z)=\{R_i/(1+2\tau_i/T)+R_i/(1+2\tau_i/T)z^{-1}\}/\{1+(1-2\tau_i/T)/(1+2\tau_i/T)z^{-1}\} \quad (22)$$

From a comparison between the equations (20) and (22), each of coefficients $b_0$, $b_i$, and $a_i$ in the IIR transfer function is defined by each of equations (221) to (223), respectively.

$$b_0=R_i/(1+2\tau_i/T) \quad (221)$$

$$b_i=R_i/(1+2\tau_i/T) \quad (222)$$

$$a_i=-\{1+(1-2\tau_i/T)(1+2\tau_i/T)\} \quad (223)$$

The dependencies of $R_i$ and $C_i$ on temperature $\theta$ are predetermined according to the equation (21) based on the measurement results of Nyquist plots of the secondary battery at different temperatures $\theta$ (see FIG. 4), respectively. In other words, each of the coefficients $b_0$, $b_i$, and $a_i$ that define the transfer function $H_i(z)$ of the i-th RC parallel circuit is defined as a dependent variable or a multivariable function when the temperature $\theta$ and sampling frequency T are taken as main variables.

Figure 3C:
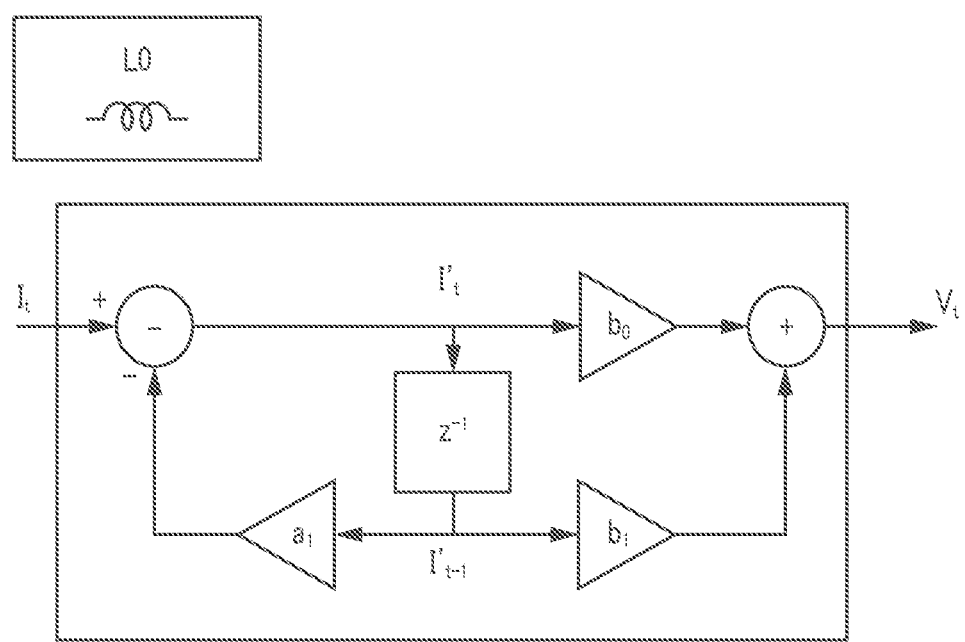
FIG. 3C is a diagram representing an IIR transfer function of an inductance component L.

The transfer function $H_L(z)$ of the coil L is defined by equation (30) as the transfer function of the IIR system. In FIG. 3C, a block diagram representing the transfer function $H_L(z)$ of the coil L is illustrated.

$$H_L(z)=(2L_0/T)(1-z^{-1})/(1+z^{-1}) \quad (30)$$

A transfer function $H_L(s)$ of the coil L in the s region is expressed by equation (31).

$$H_L(s)=sL_0 \quad (31)$$

When the transfer function $H_L(s)$ is bilinear-transformed, the transfer function $H_L(z)$ of the coil L in the z region is represented by equation (32).

$$H_L(z) = \{2L_0/T - 2L_0/Tz^{-1}\}/(1+z^{-1}) \quad (32)$$

From a comparison between the equations (30) and (32), each of the coefficients $b_0$, $b_i$, and $a_i$ in the IIR transfer function is defined by each of equations (321) to (323), respectively.

$$b_0 = 2L_0T \quad (321)$$

$$b_i = -2L_0/T \quad (322)$$

$$a_i = -1 \quad (323)$$

The dependence of $L_0$ on temperature $\theta$ is predetermined according to the equation (31) based on the measurement results of Nyquist plots of the reference secondary battery at each of different temperatures $\theta$ (see FIG. 4), respectively. In other words, each of the coefficients $b_0$ and $b_i$ that define the transfer function $H_i(z)$ of the coil L is defined as a dependent variable or a multivariable function when the temperature $\theta$ and sampling frequency T are taken as main variables.

The transfer function $Hw(z)$ of the Warburg impedance $W_0$ is defined by equation (40) as a transfer function of a FIR (Finite Impulse Response) system. In FIG. 3D, a block diagram representing the transfer function $Hw(z)$ of the Warburg impedance $W_0$ is illustrated.

Math. 2

$$Hw(z) = \Sigma_{k=0}^{n} h_k z^{-k} \quad (40)$$

A transfer function $Hw(s)$ of the Warburg impedance $W_0$ in the s region is represented by equation (41).

$$Hw(s) = Rw \tanh(sTw)^P/(sTw)^P \quad (41)$$

When the transfer function $H_L(s)$ is bilinear-transformed, the transfer function $Hw(z)$ of the Warburg impedance $W_0$ in the z region is represented by equation (42).

$$Hw(z) = Rw \tanh[(2T_w/T)(1-z^{-1})/(1+z^{-1})]^P / \{(2Tw/T)(1-z^{-1})/(1+z^{-1})\}^P \quad (42)$$

Thus, from a comparison between the equations (40) and (42), it is found to be difficult to determine each of the coefficient lhi in the FIR transfer function, respectively. Therefore, the dependencies of Rw, Tw, and p on temperature $\theta$ are determined according to the equation (41) based on the measurement results of Nyquist plots of the reference secondary battery at each of different temperatures $\theta$ (see FIG. 4), respectively. Then, the equation (42) is subjected to inverse-FFT transform to be extracted as the coefficients of delay elements $z_k$ (k=0 to n, where n is, for example, about several tens to 1000) in order to approximately define the transfer function $Hw(z)$ of the Warburg impedance $W_0$ as an FIR transfer function as in equation (40). This is derived from the fact that the influence of the Warburg impedance $W_0$ is reflected on a low frequency side in the Nyquist plots. In other words, each of the coefficients $h_k$ that define the transfer function $Hw(z)$ of the Warburg impedance $W_0$ is defined as a dependent variable or a multivariable function when the temperature $\theta$ and sampling frequency T are taken as main variables.

In FIG. 4, an example of Nyquist plots representing the measurement results of a complex impedance Z of the secondary battery 200 is illustrated together with an approximate curve of the plots. The horizontal axis is the real part ReZ of the complex impedance Z, and the vertical axis is the imaginary part -ImZ of the complex impedance Z. In a region of -ImZ>0, lower frequency complex impedance Z is represented as ReZ increases.

A value of ReZ when -ImZ=0 (FIG. 4 (first evaluation section)) corresponds to the connection resistance component $R_0$ of the secondary battery 200 (see FIG. 3A). A section in a region of -ImZ<0 (first evaluation section) surrounded by the dot-and-dash line in FIG. 4 corresponds to the impedance of wiring inductance $L_0$ of the electrodes and the like of the secondary battery 200 (see FIG. 3B). A crushed semicircular shaped section in a region of -ImZ>0 (second evaluation section) surrounded by the long dashed double-dotted line in FIG. 4 corresponds to reaction resistance and electric double layer (impedance of the first to the m-th RC parallel circuits) at the electrode interface of the secondary battery 200 (see FIG. 3C). The radius tends to be smaller as the temperature T of the secondary battery 200 increases. The influence of the Warburg impedance $W_0$ of the secondary battery 200 is reflected in an approximately linear section standing up at about 45° in a low frequency range in a region of ImZ>0 (third evaluation section) surrounded by the dashed line in FIG. 4 (see FIG. 3D).

The approximate curve of the complex impedance Z of the secondary battery, which is represented by solid Nyquist plots in FIG. 4 is determined under the assumption that the transfer function H(t) of the equivalent circuit model of the internal resistance of the secondary battery is defined according to the equation (02). Thus, values of parameters $R_0$ (see the equation (10)), $R_i$ and $C_i$ (see the equation (21)), $L_0$ (see the equation (31)), Rw, Tw, and p (see the equation (41)) are determined at each temperature $\theta$. The value of the open circuit voltage OCV in each secondary battery model is identified by the measured value of the open circuit voltage OCV (see the equation (01)). Then, secondary battery models are established by the parameter values for various types of secondary batteries 200.

(Secondary Battery Inspection Method)

An inspection method of the secondary battery 200 executed by the secondary battery inspection device 100 having the configuration mentioned above will be described.

The impulse current I(t), the voltage V(t), and the temperature $\theta$(t) of the secondary battery 200 are measured by a current sensor S1, a voltage sensor S2, and a temperature sensor S0, respectively, when the impulse current I(t) is applied by a charge/discharge device 300 to the secondary battery 200 to be inspected.

the measurement result of the temperature $\theta$(t) of the secondary battery 200 is input to the temperature compensation element 110, and a temperature compensation model parameter according to the measurement result is output from the temperature compensation element 110. Specifically, values $R_0(\theta)$, $R_i(\theta)$, $C_i(\theta)$, $L_0(\theta)$, $Rw(\theta)$, $Tw(\theta)$, and $p(\theta)$ of the parameters $R_0$ (see the equation (10)). $R_i$ and $C_i$ (see the equation (21)), $L_0$ (see the equation (31)), and Rw and Tw (see the equation (41)) according to the temperature $\theta$ are determined. These model parameters can be determined as average values of a good product population from mass-produced products of secondary batteries, and used as a reference model for pass/fail determination.

The temperature compensation model parameter is input from the temperature compensation element 110 to the first model parameter setting element 112, and the IIR model parameters $b_0(\theta, T_1)$, $b_i(\theta, T_1)$, and $a_i(\theta, T_1)$ are determined by the first model parameter setting element 112 based on the temperature compensation model parameters $R_i(\theta)$ and $C_i(\theta)$ according to the first sampling period $T_1$ (see the equations (221) to (223)). The IIR model parameters $b_0(\theta, T_1)$, $b_i(\theta, T_1)$, and $a_i(\theta, T_1)$, are determined by the first model parameter setting element 112 based on the temperature compensation model parameter $L_0(\theta)$ according to the first sampling period $T_i$ (see the equations (0.321) to (323)). The FIR model parameter $h_k(\theta, T_i)$ is determined by the first model parameter setting element 112 based on the temperature compensation model parameters $Rw(\theta, T_1)$, $Tw(\theta, T_1)$, and $p(\theta, T_1)$ according to the first sampling period $T_1$ (see the equation (40)).

Figure 5A:
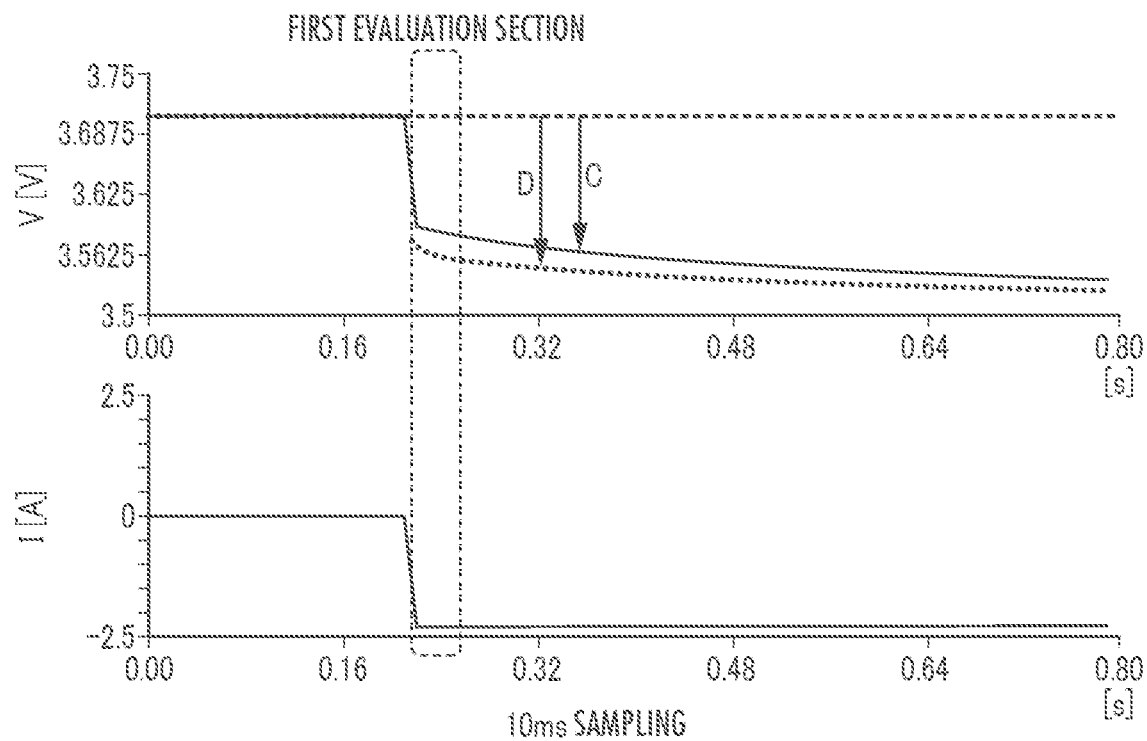
FIG. 5A is an explanatory chart related to a first evaluation index according to a first sampling period.
Figure 5B:
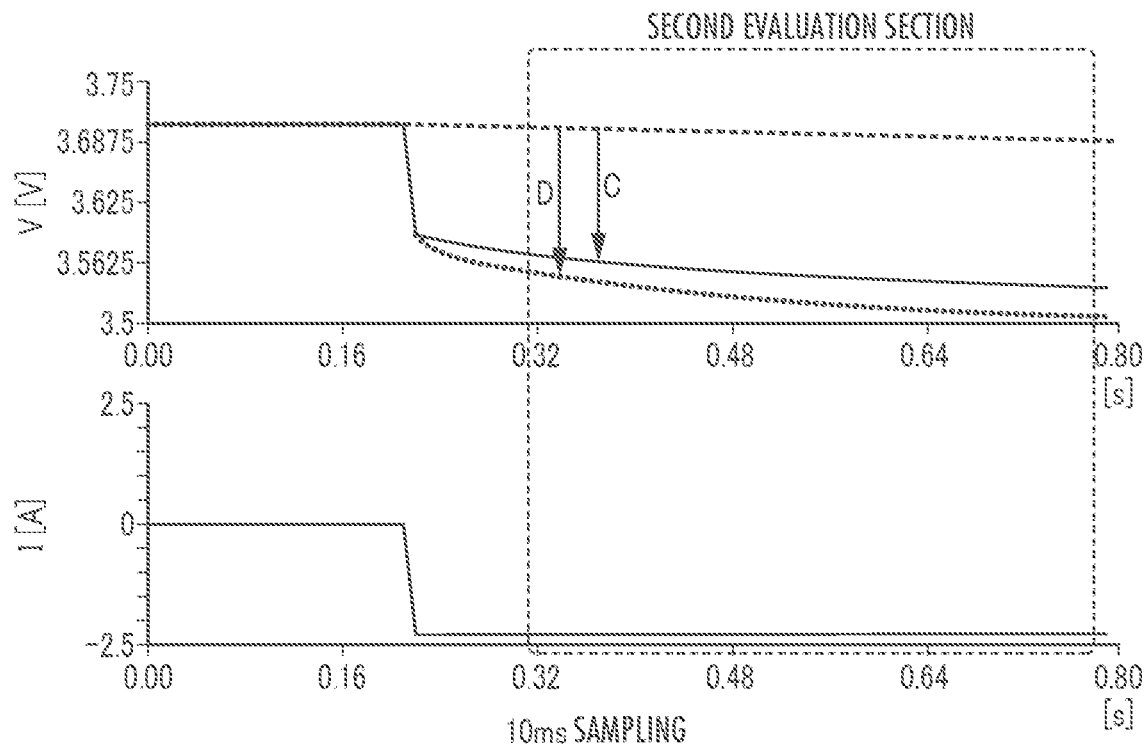
FIG. 5B is an explanatory chart related to a second evaluation index according to the first sampling period.

The voltage $V(t)$ of the secondary battery 200 is inferred by the first voltage estimation element 114 based on the measurement result of the impulse current $I(t)$ of the secondary battery 200 according to the secondary battery model defined by the transfer function $H(t)$ according to the first sampling period $T_1$ as a short period (for example, about 10 ms) (see the equation (01)). In FIG. 5A and FIG. 5B, the measured values of the voltage V of the secondary battery 200 at the time of discharge are illustrated by the dotted line, approximate curves representing the measured values of the OCV of the secondary battery 200 in each first sampling period $T_1$ are illustrated by the dashed line. and approximate curves representing the estimation results of the voltage $V(t)$ of the secondary battery 200 in each first sampling period $T_1$ by the first voltage estimation element 114 are illustrated by the solid line, respectively. Since the open circuit voltage OCV is not considered in the secondary battery model, the estimation results D of the voltage $V(t)$ of the secondary battery 200 in each first sampling period $T_1$ by the first voltage estimation element 114 is inferred based on the (CV (see FIG. 5A, FIG. 5B/down arrow D).

The temperature compensation model parameter is input from the temperature compensation element. 110 to the second model parameter setting element 122, and the IIR model parameters $b_0(\theta, T_2)$, $b_i(\theta, T_2)$, and $a_i(\theta, T_2)$ are determined by the second model parameter setting element 122 based on the temperature compensation model parameters $R_i(\theta)$ and $C_i(\theta)$ according to the second sampling period $T_2$ (see the equations (221) to (223)). The IIR model parameters $b_0(\theta T_2)$, $b_i(\theta, T_2)$, and $a_i(\theta, T_2)$ are determined by the second model parameter setting element 122 based on the temperature compensation model parameter 140) according to the second sampling period $T_2$ (see the equations (321) to (323)). The FIR model parameter $h_k(\theta, T_2)$ is determined by the second model parameter setting element 122 based on the temperature compensation model parameters $Rw(\theta, T_2)$. $Tw(\theta, T_2)$, and $p(\theta, T_2)$ according to the second sampling period $T_2$ (see the equation (40)).

The voltage $V(t)$ of the secondary battery 200 is inferred by the second voltage estimation element 124 based on the measurement result of the impulse current $I(t)$ of the secondary battery 200) according to the secondary battery model detined by the transfer function $H(t)$ according to the second sampling period $T_2$ as a long period (for example, about 1 s) (see the equation (01)). In FIG. 5C, the measured values of the voltage V of the secondary battery 200 at the time of discharge are illustrated by the solid line, an approximate curve representing the measured values of the OCV of the secondary battery 200 in each second sampling period $T_2$ is illustrated by the dashed line, and an approximate curve representing the estimation result of the voltage $V(t)$ of the secondary battery 200 in each second sampling period $T_2$ by the second voltage estimation element 124 is illustrated by the solid line. Since the open circuit voltage OCV is not considered in the secondary battery model, the estimation result E of the voltage $V(t)$ of the secondary battery 200 by the second voltage estimation element 124 is inferred based on the OCV (see FIG. 5C/down arrow E).

The voltage $V(t)$ of the secondary battery 200 is input to the secondary battery inspection device 100, and the open circuit voltage $OCV(t)$ of the secondary battery 200 is detected by the OCV detection element 102 based on input A concerned. Then, a difference $C=A-B$ of input $A=V(t)$ and output $B=OCV(t)$ of the OCV detection element 102 is output by the subtraction element 104. The difference C is illustrated by the down arrow C in each of FIG. 5A, FIG. 5B, and FIG. 5C, which represents a difference between the measured value (solid line) of the voltage V of the secondary battery 200 at the time of discharge and the measured value dotted line) of the OCV.

The difference C is input from the subtraction element 104 to the division element 116, and the estimation result D of the voltage $V(t)$ of the secondary battery 200 is input from the first voltage estimation element 114 to calculate a ratio C/D of both inputs.

C/D at each point of time in a first period (see FIG. 5A/region surrounded by the dashed box) immediately after the impulse current $I(t)$ starts flowing from the division element 116 is input to the first evaluation element 142, and the connection resistance component $R_0$ and the inductance element $L_0$ of the secondary battery 200 in the first evaluation section is evaluated by the first evaluation element 142 based on a statistical index value, such as an average value of the input, a variance value, a deviation value, or an intermediate value of the maximum value and the minimum value. Here, since contribution by $L_0$ is only the impedance on the imaginary axis and there is no contribution as the resistance value, the component to be evaluated is only $R_0$ after all. The closer C/D to 1, the smaller the change in the connection resistance component $R_0$ of the secondary battery 200 is evaluated compared with the initial state or the good product population.

C/D at each point of time in a second period (see FIG. 5B/region surrounded by the dashed box) longer than the first period and starting at the elapse of the first period after the impulse current $I(t)$ starts flowing from the division element 116 is input to the second evaluation element 144, and the reaction resistance and electric double layer (impedance of the first to the m-th RC parallel circuits) at the electrode interface of the secondary battery 200 in the second evaluation section are evaluated by the second evaluation element 144 based on the statistical index value of the input. The closer the C/D to 1, the smaller the change in the reaction resistance and electric double layer (impedance of the first to the m-th RC parallel circuits) at the electrode interface of the secondary battery 200 is evaluated compared with the initial state or the good product population. A tolerance level can be set to the calculated value of C/D for pass/fail determination.

The difference C is input from the subtraction element 104 to the division element 126, and the estimation result E of the voltage $V(t)$ of the secondary battery 200 is input from the second voltage estimation element 124 to calculate a ratio of C/E of both inputs.

C/E at each point of time in a third period (see FIG. 5C/region surrounded by the dashed box) longer than the second period and starting at the elapse of the first period after the impulse current $I(t)$ starts flowing from the division element 126 is input to the third evaluation element 146, and the Warburg impedance $W_0$ of the secondary battery 200 in the third evaluation section is evaluated by the third evaluation element 146 based on the statistical index value of the input. The closer C/E to 1, the smaller the change in the Warburg impedance $W_0$ of the secondary battery 200 is evaluated compared with the initial state or the good product population. A tolerance level can be set to the calculated value of C/E tor pass/fail determination.

The evaluation results of the first evaluation element 142, the second evaluation element 144, and the third evaluation element 146 are output to an output interface wired or wirelessly connected to the secondary battery inspection device 100.

Each of the first evaluation element 142, the second evaluation element 144, and the third evaluation element 146 can make the determination with one measurement to estimate which component of the secondary battery is the cause of a failure depending on the combination of the determination results.

Advantageous Effects of Invention

According to the secondary battery inspection device 100 of the present invention and the secondary battery inspection method executed thereby, for example, as illustrated in Table 1, when the determination result of C/D related to the first evaluation section has a relation to a first determination reference value $\gamma 1$ as expressed in equation (51), it is evaluated to be "OK (the resistance value of the cell constituent material is within a reference range)," while when the determination result of C/D does not have the relation expressed in the equation (51), it is evaluated to be "NG (the resistance value of the cell constituent material exceeds the reference)."

$$1-\gamma 1 < C/D < 1+\gamma 1 \tag{51}$$

Further, as illustrated in Table 1, when the determination result of C/D related to the second evaluation section has a relation to a second determination reference value $\gamma 2$ as expressed in equation (52). it is evaluated to be "OK (there is no abnormality in reactivity between the positive electrode and the negative electrode)," while when the determination result of C/D does not have the relation expressed in the equation (52), it is evaluated to be "NG (there is abnormality in reactivity between the positive electrode and the negative electrode)."

$$1-\gamma 2 < C/D < 1+\gamma 2 \tag{52}$$

Further, as illustrated in Table 1, when the determination result of C/E related to the third evaluation section has a relation to a third determination reference value $\gamma 3$ as expressed in equation (53). it is evaluated to be "OK (there is no shortage of electrolyte, no deterioration of the electrolyte, or the like)," while when the determination result of C/E does not have the relation expressed in the equation (53), it is evaluated to be "NG (there is a shortage of electrolyte, a deterioration of the electrolyte, or the like)."

$$1-\gamma 3 < C/D < 1+\gamma 3 \tag{53}$$

Thus, according to the present invention, not only can the pass/fail determination of the secondary battery be simply made but also it can be estimated which of components of the secondary battery causes a problem by one measurement.

The evaluation results may be transmitted from the secondary battery inspection device 100 to a client such as a smartphone, a tablet terminal, or a personal computer, and output to and displayed on an output interface (display) that constitutes part of the client. Thus, since a defect factor can also be estimated while facilitating the inspection of the secondary battery 200, not only can the inspection accuracy be improved, but also a user of the client who engages in the production process can get smooth feedback.

TABLE 1

| Individual Content Abnormality | Determination Result in First Evaluation Section Determination Reference $\gamma 1$ | Determination Result in Second Evaluation Section Determination Reference $\gamma 2$ | Determination Result in Third Evaluation Section Determination Reference $\gamma 3$ | Assumed Factor |
|---|---|---|---|---|
| Abnormality of Ro | NG | NG | NG | Increased Resistance of Cell Constituent Material (Contact Failure or Electrical Resistance) |
| Abnormality of Rn, Cn | OK | NG | NG | Abnormality in Reactivity of Positive Electrode and Negative Electrode |
| Abnormality of WO | OK | OK | NG | Ion Diffusion Reaction in Electrode. Such as Shortage or Deteriora lion of Electrolyte |

DESCRIPTION OF REFERENCE NUMERALS

100 ... secondary battery inspection device, 102 ... OCV detection element (voltage recognition element), 104 ... subtraction element, 110 ... temperature compensation element, 112 ... first model parameter setting element, 114 ... first voltage estimation element, 122 ... second model parameter setting element, 124 ... second voltage estimation element, 200 ... secondary battery, 300 ... charge/discharge device.

The invention claimed is:
1. A secondary battery inspection device operably coupled to a current sensor and a voltage sensor respectively configured to measure an applied impulse current and a voltage of a secondary battery under inspection, the secondary battery inspection device comprising:

a memory storing a program and data related to at least one secondary battery model; and a hardware processor which, under control of the program stored in the memory, is configured to execute processes comprising:

a voltage recognition process comprising receiving, from the voltage sensor, input of a measurement result of the voltage of the secondary battery when the impulse current flows into the secondary battery;

a model parameter setting process comprising identifying values of coefficients of transfer functions respectively representing an IIR system and an FIR system, each of the transfer functions being defined by a value of a coefficient in an s region expressing an impedance of an internal resistance of the secondary battery, and a sampling period which is an inverse of a sampling frequency when the transfer function in the s region is converted by bilinear-transformation to a transfer function in a z region, and the values of the coefficients being identified, based on a predetermined sampling period, as a value of a model parameter of a secondary battery model, from among the at least one secondary battery model stored in the memory, in which the impedance of the internal resistance of the secondary battery is expressed by the transfer functions respectively representing the IIR system and the FIR system;

a voltage estimation process comprising receiving, from the current sensor, input of a measurement result of the impulse current, inputting the measurement result of the impulse current to a specified model as the secondary battery model the value of the model parameter of which is identified in the model parameter setting process, and estimating a model output voltage as a voltage change form output from the specified model;

an evaluation process comprising evaluating a performance of the secondary battery according to the predetermined sampling period based on the measurement result of the voltage of the secondary battery received in the voltage recognition process, and the specified model output voltage estimated in the voltage estimation process; and an output process comprising outputting a result of the evaluation process.

2. The secondary battery inspection device according to claim 1, wherein:

the model parameter setting element individually identifies the value of the model parameter based on each of a plurality of predetermined sampling periods, respectively, the voltage estimation element estimates a plurality of model output voltages as voltage change forms respectively output from a plurality of specified models by inputting the measurement result of the impulse current to the plurality of specified models as individual secondary battery models with the values of the model parameter identified in the model parameter setting process, and the evaluation element process evaluates a plurality of performances of the secondary battery respectively according to respective ones of the plurality of predetermined sampling periods based on the measurement result of the voltage of the secondary battery received in the voltage recognition process, and respective ones of the plurality of specified model output voltages estimated in the voltage estimation process.

3. The secondary battery inspection device according to claim 1, wherein:

the secondary battery inspection device is further operably coupled to a temperature sensor configured to measure a temperature of the secondary battery, the process further comprise a temperature compensation process comprising receiving, from the temperature sensor, input of a measurement result of the temperature of the secondary battery, and the model parameter setting process corrects the value of the model parameter based on the measurement result of the temperature of the secondary battery received in the temperature compensation process.

4. A secondary battery inspection method executed by an inspection device operably coupled to a current sensor and a voltage sensor respectively configured to measure an applied impulse current and a voltage of a secondary battery under inspection, the secondary battery inspection device comprising a memory and a hardware processor, the memory storing data related to at least one secondary battery mode, and the method comprising:

a voltage recognition process comprising receiving, from the voltage sensor, input of a measurement result of the voltage of the secondary battery when the impulse current flows into the secondary battery;

a model parameter setting process comprising identifying values of coefficients of transfer functions respectively representing an IIR system and an FIR system, each of the transfer functions being defined by a value of a coefficient in an s region expressing an impedance of an internal resistance of the secondary battery, and a sampling period which is an inverse of a sampling frequency when the transfer function in the s region is converted by bilinear-transformation to a transfer function in a z region, and the values of the coefficients being identified, based on a predetermined sampling period, as a value of a model parameter of a secondary battery model, from among the at least one secondary battery model stored in the memory, in which the impedance of the internal resistance of the secondary battery is expressed by the transfer functions respectively representing the IIR system and the FIR system;

a voltage estimation process comprising receiving, from the current sensor, input of a measurement result of the impulse current, inputting the measurement result of the impulse current to a specified model as the secondary battery model the value of the model parameter of which is identified in the model parameter setting process, and estimating a model output voltage as a voltage change form output from the specified model;

an evaluation process comprising evaluating a performance of the secondary battery according to the predetermined sampling period based on the measurement result of the voltage of the secondary battery received in the voltage recognition process, and the specified model output voltage estimated in the voltage estimation process; and an output process comprising outputting a result of the evaluation process.

* * * * *